United States Patent

(12) United States Patent
Ku et al.

(10) Patent No.: US 7,706,199 B2
(45) Date of Patent: Apr. 27, 2010

(54) CIRCUIT AND METHOD FOR PARALLEL TEST OF MEMORY DEVICE

(75) Inventors: Young-Jun Ku, Kyoungki-do (KR); Kee-Teok Park, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 93 days.

(21) Appl. No.: 12/000,123

(22) Filed: Dec. 10, 2007

(65) Prior Publication Data

US 2008/0212383 A1 Sep. 4, 2008

(30) Foreign Application Priority Data

Mar. 2, 2007 (KR) .................. 10-2007-0020696

(51) Int. Cl.
*G11C 29/00* (2006.01)
(52) U.S. Cl. .................. 365/201; 365/200; 365/205
(58) Field of Classification Search .................. 365/201, 365/200, 230.05
See application file for complete search history.

(56) References Cited

U.S. PATENT DOCUMENTS

| 5,075,892 | A | | 12/1991 | Choy |
| 5,471,480 | A | | 11/1995 | You |
| 5,511,029 | A | * | 4/1996 | Sawada et al. ............... 365/201 |
| 6,381,718 | B1 | * | 4/2002 | Brown et al. ................. 714/724 |
| 6,446,227 | B1 | * | 9/2002 | Hashimoto ................... 714/719 |
| 2002/0044487 | A1 | * | 4/2002 | Roohparvar et al. ... 365/189.05 |
| 2005/0207245 | A1 | * | 9/2005 | Kang ........................ 365/201 |
| 2007/0070740 | A1 | * | 3/2007 | Song ......................... 365/201 |

FOREIGN PATENT DOCUMENTS

| KR | 1991-005306 | 7/1990 |
| KR | 1995-0001293 | 11/1993 |

OTHER PUBLICATIONS

Korean Office Action, with English Translation, issued in Korean Patent Application No. 10-2007-0020696, dated on Feb. 28, 2008.

* cited by examiner

*Primary Examiner*—Vu A Le
*Assistant Examiner*—Han Yang
(74) *Attorney, Agent, or Firm*—IP & T Law Firm PLC

(57) ABSTRACT

A test circuit in a memory device includes a first compression unit configured to compress data of a plurality of cells to transmit first compressed data to a plurality of input/output lines, and a second compression unit configured to compress the first compressed data on the plurality of input/output line to output second compressed data to at least one output pin, wherein the second compression unit operates in a low compressing mode and a high compressing mode in response to a data compression selecting signal.

14 Claims, 5 Drawing Sheets

CIRCUIT AND METHOD FOR PARALLEL TEST OF MEMORY DEVICE

CROSS-REFERENCE TO RELATED APPLICATIONS

The present invention claims priority to Korean patent application number 2007-0020696, filed on Mar. 2, 2007, which is incorporated by reference in its entirety.

BACKGROUND OF THE INVENTION

The present invention relates to a memory device, and more particularly, to a circuit and method for testing the memory device in parallel.

Generally, in the memory device such as a dynamic random access memory (DRAM), a read and write operation of data should be performed accurately. For the accurate read and write operation, even one failed cell is not allowed on chip.

However, as tens of millions of cells are integrated on a chip along with the very large scaled integration trend, despite of the development of the fabricating process, the possibility of existing the failed cell is relatively higher. The reliability of the memory device can not be secured unless an accurate test on this failed cell is performed.

When testing the memory device, it is desirable to test on the tens of millions of cells speedily as well as reliably. Especially, reduction of time for developing and testing the memory device until a shipment thereof effects on a product cost. Therefore, it is a very important issue to reduce the time taken for testing the memory device for the purpose of a competition between manufacturing companies and the efficiency in production.

Generally, when performing a test on each cell of a semiconductor memory device, it takes a long time, which causes an increase in the cost.

Therefore, a parallel test is used in order to reduce the test time. In the parallel test, the same data is recorded in a plurality of cells, and the data recorded in the cells are read out in parallel and checked to determine whether the data outputted from the cells are identical to each other, that is, whether the data are correctly recorded in and read out from cells.

SUMMARY OF THE INVENTION

Embodiments of the present invention are directed to providing a parallel test circuit of a memory device for reducing the number of pins required in case of testing cell data without deteriorating cell repair efficiency.

In accordance with an aspect of the present invention, there is provided a test circuit in a memory device. The test circuit includes a first compression unit configured to compress data of a plurality of cells to transmit first compressed data to a plurality of input/output lines, and a second compression unit configured to compress the first compressed data on the plurality of input/output line to output second compressed data to at least one output pin, wherein the second compression unit operates in a low compressing mode and a high compressing mode in response to a data compression selecting signal.

In accordance with another aspect of the present invention, there is provided a method for testing in a memory device. The method includes testing the memory device in a high compressing mode in response to a test mode signal, testing the memory device in a low compressing mode in response to the test mode signal when the existence of a failed cell is detected, thereby finding out a location of the failed cell, and repairing the failed cell.

DESCRIPTION OF SPECIFIC EMBODIMENTS

Figure 1:
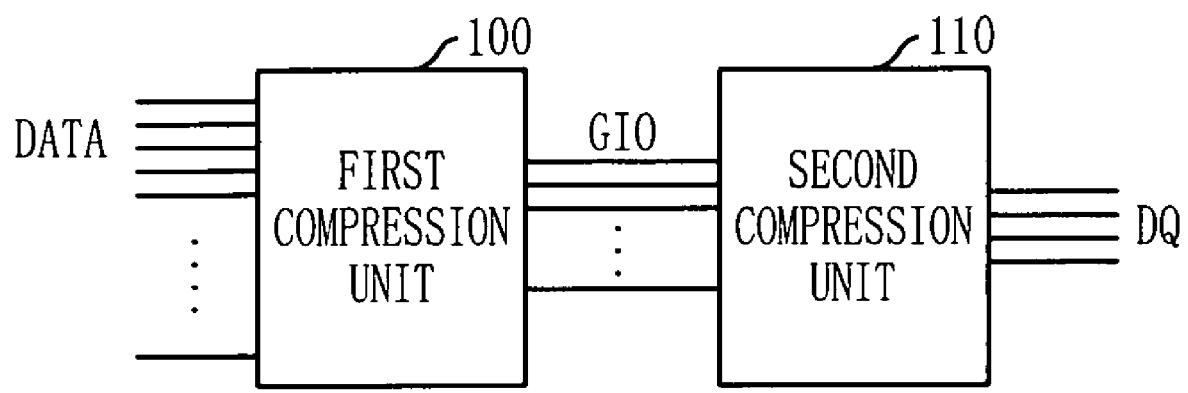
FIG. 1 illustrates a block diagram of a parallel test circuit of a memory device in accordance with a first embodiment of the present invention.

FIG. 1 illustrates a block diagram of a parallel test circuit of a memory device in accordance with a first embodiment of the present invention.

The parallel test circuit in the memory device includes a first compression unit 100 and a second compression unit 110. The first compression unit 100 generates at least one compressed data by checking whether a plurality of cell data are identical to each other and transmits the compressed data onto a corresponding data input/output (I/O) line, e.g., a global I/O line GIO. The second compression unit 110 decides whether the data on the data I/O lines GIO have the same logic value and transmits the result to at least one output pins DQ.

Figure 2:
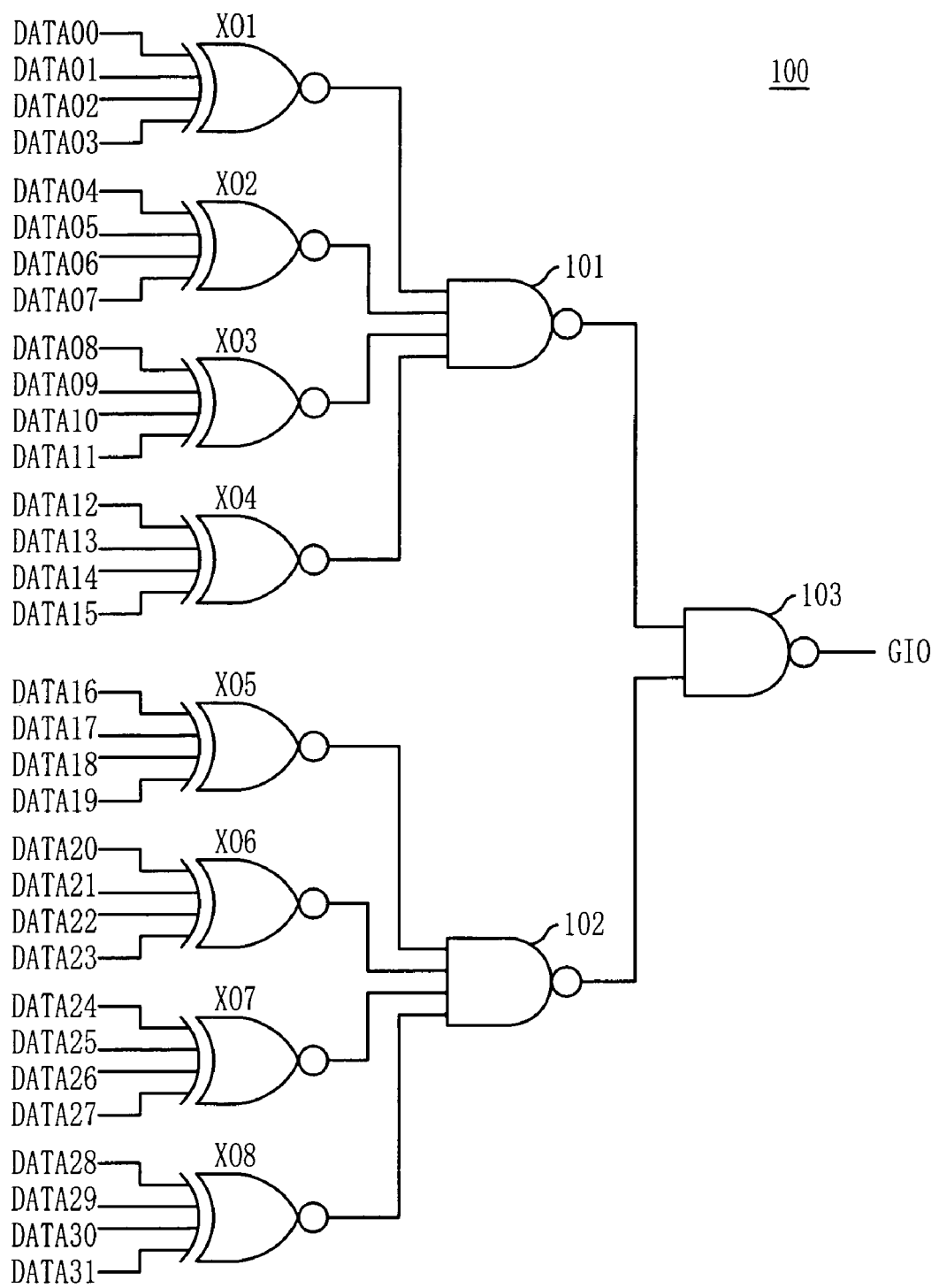
FIG. 2 shows a circuit diagram of a first compression unit in FIG. 1.

FIG. 2 shows a circuit diagram of a first compression unit 100 in FIG. 1.

The first compression unit 100 compresses a plurality of cell data, e.g., DATA00 to DATA31 and transmits the compressed data onto the global I/O line G10.

The first compression unit 100 logically combines the plurality of cell data DATA00 to DATA31 which are transmitted thereto through local I/O lines LIO using first to eighth XNOR gates X01 to X08. FIG. 2 illustrates that each of the XNOR gates X01 to X08 logically combines corresponding four data. When the corresponding four data have the same logical value, each of the XNOR gates X01 to X08 outputs a logic 'high' value and, otherwise, outputs a logic 'low' value.

A first NAND gate 101 performs a NAND operation on outputs from the first to the fourth XNOR gates X01 to X04. A second NAND gate 102 performs a NAND operation on outputs from the fifth to the eighth XNOR gates X05 to X08. At this time, when all of the outputs of the first to the eighth XNOR gates X01 to X08, which are inputted to the first and the second NAND gates 101 and 102, have a logic 'high' value, the first and the second NAND gates 101 and 102 output a logic 'high' level. A third NAND gate 103 performs a NAND operation on outputs from the first and the second NAND gates 101 and 102 and transmits the result to the global I/O line GIO.

As can be seen from the above discussion, when all of the data DATA00 to DATA31 inputted to the first to the eighth XNOR gates X01 to X08 have the same logic value, a signal having a logic 'high' level is outputted onto the global I/O line GIO.

That is, the above described "compression" means that it outputs a signal indicating whether a plurality of cell data are identical to each other while not knowing a logic value itself of each cell data.

FIG. 2 illustrates a part of the first compression unit 100. The first compression unit 100 includes at least one circuit illustrated in FIG. 2 and each circuit corresponds to each global I/O line GIO.

Figure 3:
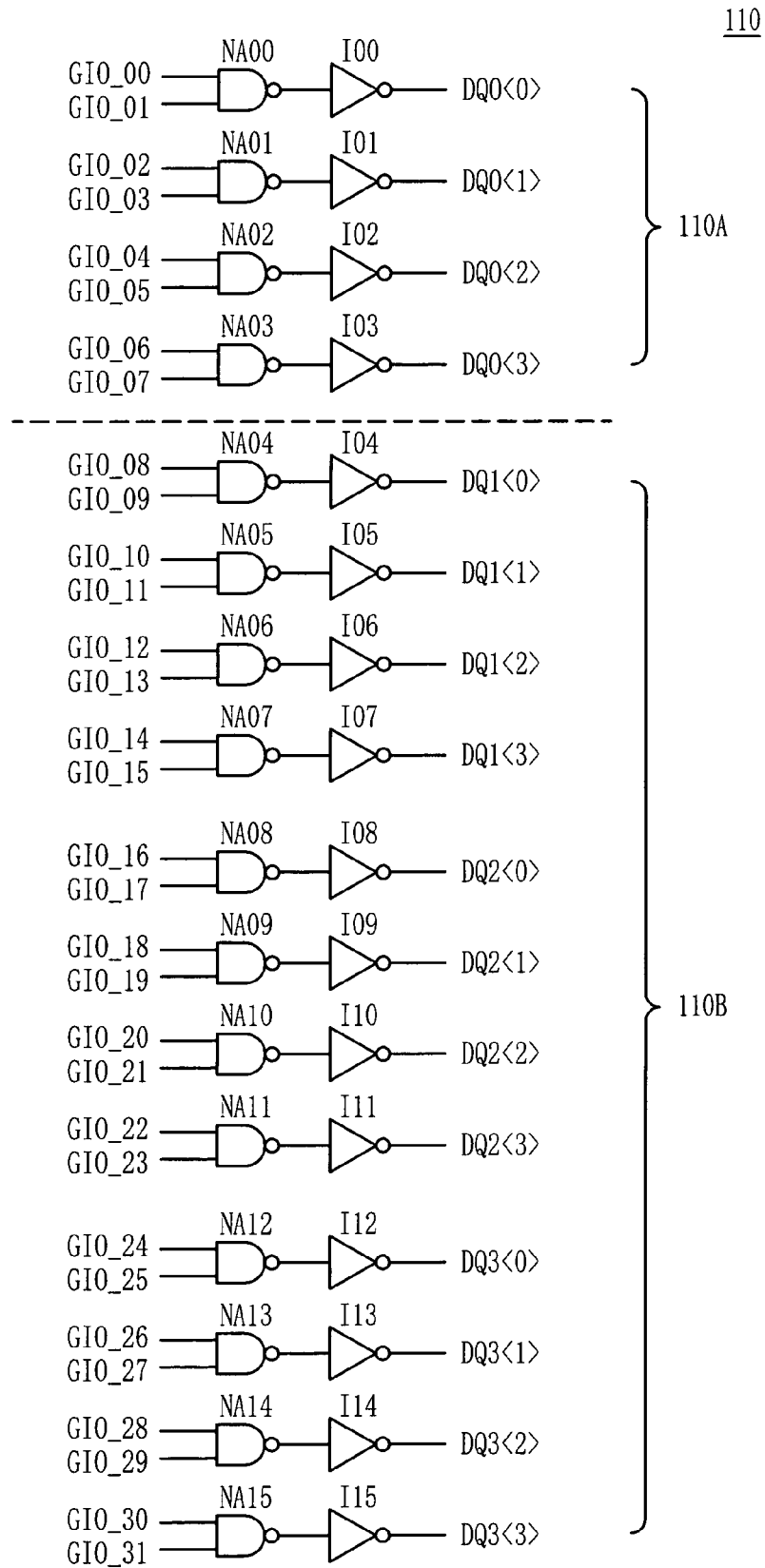
FIG. 3 provides a circuit diagram of a second compression unit in FIG. 1.

FIG. 3 provides a circuit diagram of a second compression unit in FIG. 1.

The second compression unit 110 compresses outputs of the first compression unit 100, i.e., signals on the global I/O lines GIO and outputs the compression result through output pins, e.g., DQ0 to DQ3.

The second compression unit 110 includes a upper compression unit 110A and a lower compression unit 110B employing a plurality of NAND gate NA00 to NA15 for logically combining data on a plurality of global I/O lines, e.g., GIO_00 to GIO_31, and a plurality of inverters 100 to 115 for inverting outputs from the NAND gates NA00 to NA15 and outputting the inverted data through the output pins DQ0 to DQ3.

In detail, the first NAND gate NA00 logically combines data on the first and the second global I/O lines GIO_00 and GIO_01. Sequentially, the first inverter 100 inverts the logically combined data. Therefore, the first output pin DQ0<0> outputs a logic 'high' level when the data on the first and the second global I/O lines GIO_00 and GIO_01 have a logic 'high' level. Likewise, the second NAND gate NA01 logically combines data on the third and the fourth global I/O lines GIO_02 and GIO_03. The third NAND gate NA02 performs a logical operation on data on the fifth and the sixth global I/O lines GIO_04 and GIO_05. The output pins DQ0<1> and DQ0<2> output each results, respectively.

The first to the fourth output pins DQ0<0>, DQ0<1>, DQ0<2>, and DQ0<3> represent an identical output pin. That is, (through a corresponding output pin), one data is outputted per clock in order of <0>, <1>, <2>, and <3>. The present invention employs a pipe latch scheme to output data on a clock basis.

Outputting the logic 'high' level signal through the output pins DQ0 to DQ3 means that all of the global I/O lines GIO_00 to GIO_31 corresponding to the output pins DQ0 to DQ3 have a logic 'high' value. The fact that the global I/O lines GIO_00 to GIO_31 corresponding to the output pins DQ0 to DQ3 have the logic 'high' level means that data corresponding to the global I/O lines are correct, i.e., identical to each other. Therefore, whether the data is correct or wrong is decided based on logic levels of the outputted signals from the output pins DQ0 to DQ3.

To sum up, the first compression unit 100 generates compressed data by comparing data read out from a plurality of cells and transmits the compressed data to the global I/O lines GIO. The second compression unit 110 decides whether the compressed data on the global I/O lines GIO have an identical logic value and transmits the result to the output pin DQ.

When the above described parallel test circuit in accordance with the first embodiment of the present invention is applied to a memory device which has 8 banks, each bank outputs 128 data to 4 I/O pins (the total number of data for 8 banks:128*8=1024).

In case of testing a memory device employing the parallel test circuit described above with a test device capable of testing 64 pins, it is possible to test 16 chips at a time. If it is possible to decide whether data from one chip with one pin is correct or wrong, the number of chips testable at one time is 64. As a result, the time and cost required for the chip test may substantially deteriorate.

However, in case that the number of pins needed for the chip test is overly reduced, i.e., the data compression is overly performed, it is harder to find out failed cells and thus the repair efficiency is also reduced.

Figure 4:
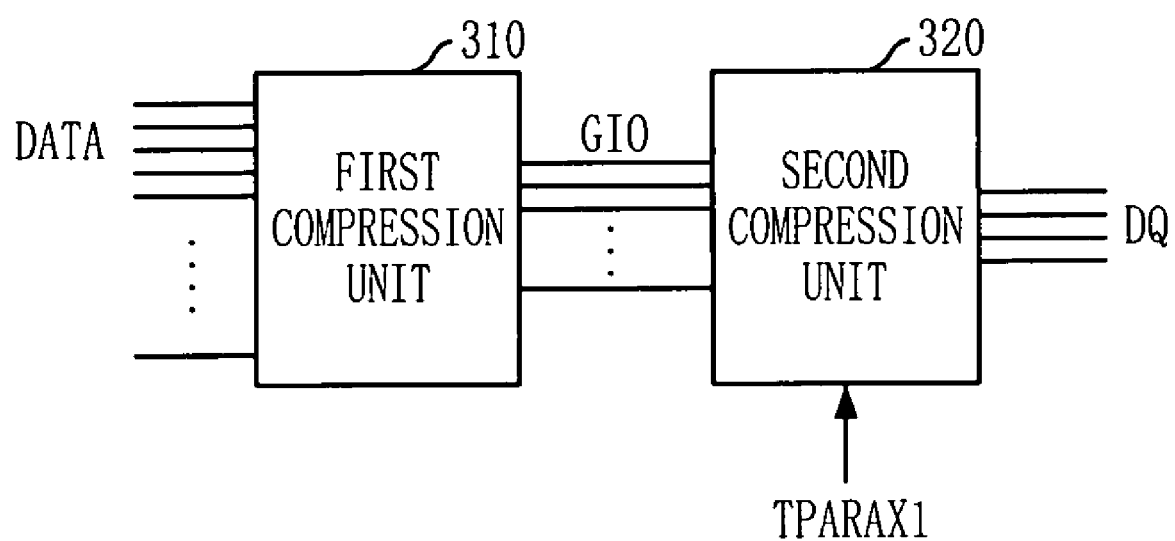
FIG. 4 describes a block diagram of a parallel test circuit in a memory device in accordance with a second embodiment of the present invention.

FIG. 4 describes a block diagram of a parallel test circuit in a memory device in accordance with a second embodiment of the present invention.

The parallel test circuit in accordance with the second embodiment of the present invention includes a first compression unit 310 and a second compression unit 320. The first compression unit 310 compresses a plurality of memory cell data DATA and transmits the first compressed data onto a plurality of global I/O lines GIO. The second compression unit 320 compresses the first compressed data on the plurality of global I/O lines and outputs the second compressed data to at least one output pin DQ, wherein the number of compressing targets, i.e., the number of global I/O lines corresponding to one output pin DQ is changed based on a data compression selecting signal TPARAX1.

The first compression unit 310 plays the same role as the first compression unit 100 in accordance with the first embodiment of the present invention. Therefore, the first compression unit 310 may have the same constitution as the first compression unit 100 in FIG. 2.

The second compression unit 320 checks whether the compressed data on the plurality of global I/O lines GIO are identical with each other. Sequentially, the second compression unit 320 outputs signals having different logic values according to the checked result as the second compressed data to at least one output pin DQ.

The second compression unit 110 in accordance with the first embodiment of the present invention logically combines two compressed data on the two global I/O lines and sequentially outputs the logically combined data to one output pin DQ four times on the clock basis. That is, 8 data global I/O lines correspond to one output pin DQ as described above referring to FIG. 3. On the other hand, the second compression unit 320 in accordance with the second embodiment of the present invention logically combines data on much more global I/O lines, e.g., 8 global I/O lines and outputs the logically combined data four times on the clock basis. That is, each output pin DQ can correspond to much more global I/O lines and, thus, according to a scheme which is used, a test of an entire chip can be performed by using only one output pin DQ.

At this time, in response to the data compression selecting signal TPARAX1, the second compression unit 320 can logically combine data on two data I/O global lines GIO like the first embodiment or logically combine data on more than two data global I/O lines GIO and outputs the combined data to the output line DQ. That is, the selection of compressibility depends on an activation of the data compression selecting signal TPARAX1.

When the second compression unit 320 performs a high data compression in response to the enabled data compression selecting signal TPARAX1, it is possible to accomplish the chip test with less output pins DQ, resulting in the reduction of the test time and cost.

On the other hand, when the data compression selecting signal TPARAX1 is disabled and, thus, the second compression unit 320 performs a low compression, more output pins DQ are used to test the chip. However, finding failed cells is easier than when employing the high compression, so that a repair efficiency becomes higher.

Figure 5:
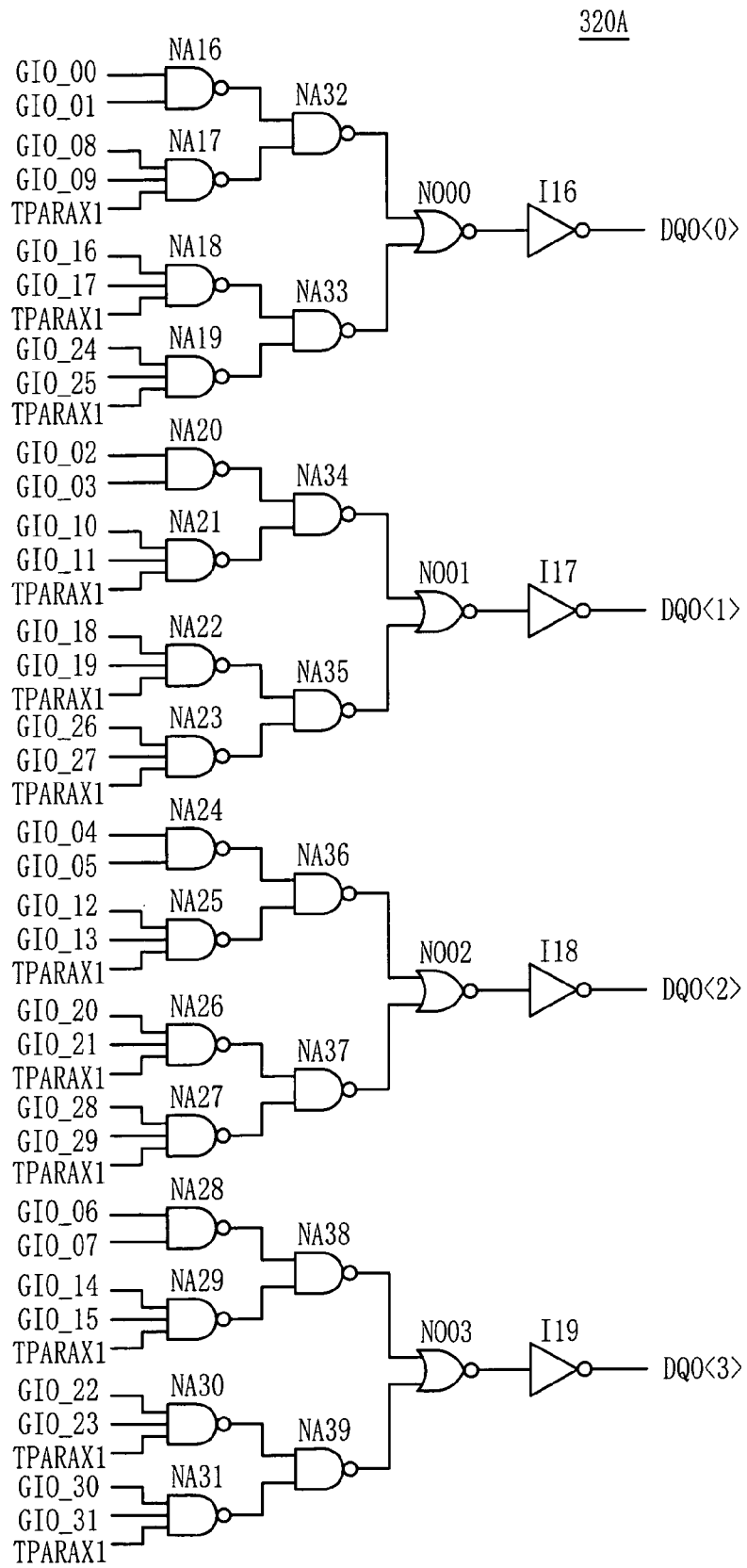
FIG. 5 depicts a circuit diagram of a high compression unit of the second compression unit in FIG. 4.

FIG. 5 depicts a circuit diagram of a high compression unit of the second compression unit in FIG. 4.

The second compression unit 320 in accordance with the second embodiment of the present invention is configured to include a low compression unit (not shown) having the same constitution as the lower compression unit 110B of the second compression unit 110 in FIG. 3 and the high compression unit 320A in FIG. 5.

The low compression unit compares and compresses the data on a plurality of data global I/O lines GIO_08 to GIO_31.

The low compression unit includes a plurality of NAND gates for performing the operations and compressions on the data on the plurality of global I/O lines GIO_08 to GIO_31 as shown in FIG. 3.

On the other hand, the high compression unit 320A compares and compresses more data on a plurality of global I/O lines GIO_00 to GIO_31. That is, since the compressibility of the high compression unit 320A is higher than that of the low compression unit, in case of compressing data with the high compression unit 320A, a required number of output pins reduces. That is, the number of I/O global lines corresponding to one output pin increases.

The high compression unit 320A operates in response to the data compression selecting signal TPARAX1. That is, when the data compression selecting signal TPARAX1 is enabled, as explained above, it operates in a high compression mode to reduce the number of required output pins. On the other hand, when the data compression selecting signal TPARAX1 is disabled, it operates in a compression mode like the upper compression unit 110A in FIG. 3.

The high compression unit 320A includes a plurality of first NAND gates NA16, NA20, NA24 and NA28 for logically combining data on a plurality of global I/O lines GIO_00 to GIO_07, a plurality of second NAND gates NA17 to NA19, NA21 to NA23, NA25 to NA27, and NA29 to NA31 for logically combining data on a plurality of global I/O lines GIO_08 to GIO_31 in response to the data compression selecting signal TPARAX1, a plurality of third NAND gates NA32 to NA39 for logically combining outputs of the plurality of first and second NAND gates NA16 to NA31, and a plurality of NOR gates NO00 to NO03 for logically combining outputs of the third NAND gates NA32 to 39.

In the high compression mode activated in response to the enabled data compression selecting signal TPARAX1, the second NAND gates NA17 to NA19, NA21 to NA23, NA25 to NA27, and NA29 to NA31 operates like two-input NAND gates. The first and the second NAND gates NA16 to NA31 logically combine two data on their corresponding global I/O lines, respectively. The third NAND gates NA32 to NA39 logically combine the outputs of the first and the second NAND gates NA16 to NA31. Also, the NOR gates NO00 to NO03 logically combine the outputs of the third NAND gates NA32 to NA39. Inverters 116 to 119 invert outputs of the NOR gates NO00 to NO03, respectively. Therefore, for example, DQ0<0> outputs a logic 'high' value when all of the 8 I/O lines GIO_00, 01, 08, 09, 16, 17, 24 and 25 have a logic 'high' value. This means that the data loaded onto the 8 I/O global lines GIO_00, 01, 08, 09, 16, 17, 24 and 25 are identical to each other. In this case, by outputting the compressed data during four clocks, i.e., DQ0<0> to DQ0<3>, the parallel test of the memory device with one output pin is performed.

In the low compression mode activated in response to the disabled data compression selecting signal TPARAX1, all of the second NAND gates NA17 to NA19, NA21 to 23, NA25 to 27, and NA29 to NA31 always output a 'high' value in response to the disables data compression selecting signal TPARAX1 having a logic 'low' level. Therefore, the third NAND gates NA32, NA34, NA36, NA38 and NOR gates NO00 to NO03 act as inverters. That is, only the outputs of the first NAND gates NA16, NA20, NA24, NA28 are transmitted to the DQ0<0>. This means the high compression unit 320A operates identically with the upper compression unit 110A in FIG. 3. At this time, since the second compression unit 320 in accordance with the second embodiment of the present invention may include the upper compression unit 110A and the lower compression unit 110B in FIG. 3, the second compression unit 320 operates identically with the second compression unit 110. In this case, the compressed data are outputted through 4 pins during 4 clocks, and thus, the parallel test is performed by 4 pins DQ0 to DQ3.

Since the present invention can choose a mode of data compressibility, it is possible to reduce the test time using the high compression mode or to reduce a scope of searching failed cells using the low compression mode to find the failed cells easily.

Described embodiments exemplify, in figures, the global I/O line GIO as the I/O line and the DQ pin as the output pin. This is because the memory device uses the global I/O line GIO as the I/O line and the data DQ pin as the output pin for the parallel test. However, the present invention is applicable to other memory devices having a different line and pin structure.

Hereinafter, there is described a method for performing the parallel test of a memory device in accordance with the second embodiment of the present invention.

The memory device with the parallel test circuit which changes the compressibility includes starting a high compression mode in response to a test mode signal; testing the memory device in parallel in the high compression mode; starting a low compression mode in response to the test mode signal when an error is found in the high compression mode, i.e., when the existence of a failed cell is detected; finding out the location of the failed cell by parallel testing of the memory device in parallel in the low compression mode; and repairing the failed cell.

That is, at first, the high compression mode starts according to the enablement of the data compression selecting signal TPARAX1 which is used herein as the test mode signal. Therefore, the parallel test for the memory device is possible with a small number of pins, for example, one pin as described above with reference to FIG. 5. When there is no error, i.e., no failed cell, the test is finished.

Meanwhile, when the error is found, the low compression mode starts according to the disablement of the data compression selecting signal TPARAX1 to test the memory device with more pins, for example, 4 pins. Since a range for searching the failed cell is in inverse proportion to the compressibility, finding the failed cell becomes easier in the low compression mode. Lastly, the failed cell is repaired.

The present invention can increase the efficiency of a parallel test circuit in a memory device to thereby reduce the number of pins required for the parallel test to one. As a result, the test time can be substantially reduced.

Since the compressibility is also selectable, it is possible to easily find failed cells by performing the low compression mode when the existence of the failed cells is detected and to increase the repair efficiency.

While the present invention has been described with respect to the specific embodiments, it will be apparent to those skilled in the art that various changes and modifications may be made without departing from the spirit and scope of the invention as defined in the following claims.

What is claimed is:
1. A test circuit in a memory device, comprising:
   a first compression unit configured to compress data of a plurality of cells and transmit a first compressed data to a plurality of input/output (I/O) lines; and
   a second compression unit configured to compress the first compressed data on the plurality of I/O lines and output a second compressed data to at least one output pin, wherein the second compression unit selectively operates in a low compressing mode or a high compressing mode in response to a data compression selecting signal.

2. The test circuit as recited in claim 1, wherein the second compression unit changes the number of I/O lines corresponding to one output pin in response to the data compression selecting signal.

3. The test circuit as recited in claim 1, wherein the first compression unit generates the first compressed data whose logic values are determined by checking whether the data of the plurality of cells are identical to each other.

4. The test circuit as recited in claim 1, wherein the second compression unit outputs the second compressed data whose logic values are determined by comparing whether the data on the I/O lines have the same logic value to the at least one output pin.

5. The test circuit as recited in claim 4, wherein the second compression unit includes:
   a first compression sector for comparing and compressing the first compressed data on the plurality of I/O lines in the low compression mode; and
   a second compression sector for comparing and compressing the first compressed data on the plurality of I/O lines in the high compression mode or the low compression in response to the data compression selecting signal,
   wherein the number of the first compressed data compared at one time and outputted through one output pin in the high compression mode is larger than that in the low compression mode.

6. The test circuit as recited in claim 5, wherein the second compression unit changes the number of the output pins outputting the second compressed data according to whether the low compression mode or the high compression mode is activated.

7. The test circuit as recited in claim 6, wherein the second compression unit outputs the result of compression from the second compression sector through one output pin.

8. The test circuit as recited in claim 5, wherein the first compression sector includes a plurality of NAND gates for comparing and compressing the first compressed data on the plurality of I/O lines.

9. The test circuit as recited in claim 5, wherein the second compression sector transmits highly compressed data to the at least one output pin when the data compression selecting signal is enabled and transmits lowly compressed data to the at least one output pin when the data compression selecting signal is disabled.

10. The test circuit as recited in claim 9, wherein the second compression sector includes:
    a plurality of first NAND gates for performing a logical operation and compression on the first compressed data on some part of the plurality of I/O lines;
    a plurality of second NAND gates for performing a logical operation and compression on the first compressed data on the remaining part of the plurality of I/O lines in response to the data compression selecting signal;
    a plurality of third NAND gates for performing a logical operation and compression on outputs of the plurality of first and second NAND gates; and
    a plurality of NOR gates for performing a logical operation and compression on outputs of the plurality of third NAND gates.

11. The test circuit as recited in claim 1, wherein the I/O line is a global I/O line and the output pin is a data output pin.

12. A method for testing a memory device, the method comprising:
    testing the memory device in a high compression mode in response to a test mode signal;
    testing the memory device in a low compression mode in response to the test mode signal when the existence of a failed cell is detected, thereby finding out a location of the failed cell; and
    repairing the failed cell.

13. The method as recited in claim 12, wherein the high and low compression modes require different numbers of output pins through which compressed data are outputted.

14. The method as recited in claim 13, wherein the number of output pins required in the high compression mode is one.

* * * * *